(12) United States Patent
Matsumoto et al.

(10) Patent No.: US 11,175,760 B2
(45) Date of Patent: Nov. 16, 2021

(54) DISPLAY DEVICE AND METHOD OF MANUFACTURING DISPLAY DEVICE

(71) Applicant: Japan Display Inc., Tokyo (JP)

(72) Inventors: Yuko Matsumoto, Tokyo (JP); Hajime Akimoto, Tokyo (JP); Mitsuhide Miyamoto, Tokyo (JP); Yusuke Tada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/014,080

(22) Filed: Sep. 8, 2020

(65) Prior Publication Data
US 2020/0409487 A1    Dec. 31, 2020

Related U.S. Application Data

(63) Continuation of application No. PCT/JP2019/004440, filed on Feb. 7, 2019.

(30) Foreign Application Priority Data

Mar. 9, 2018 (JP) .............................. JP2018-042980

(51) Int. Cl.
*G06F 3/041* (2006.01)
*H01L 51/52* (2006.01)
(Continued)

(52) U.S. Cl.
CPC ............ *G06F 3/041* (2013.01); *H01L 27/323* (2013.01); *H01L 51/5253* (2013.01);
(Continued)

(58) Field of Classification Search
CPC ............... H01L 27/323; H01L 27/3276; H01L 51/5253; H01L 51/56; H01L 21/266
See application file for complete search history.

(56) References Cited

U.S. PATENT DOCUMENTS 10,170,502 B2 *   1/2019   Jeong ................ H01L 21/31144
10,431,637 B2 *   10/2019   Jin ......................... H01L 27/323
(Continued)

FOREIGN PATENT DOCUMENTS

EP         0731387 A2 *   9/1996         G03F 1/50
JP       2003-177507 A     6/2003
(Continued)

OTHER PUBLICATIONS

International Search Report dated May 7, 2019 for the PCT application No. PCT/JP2019/004440, with English translation.

*Primary Examiner* — Sardis F Azongha
(74) *Attorney, Agent, or Firm* — Michael Best & Friedrich LLP

(57) ABSTRACT

The method for manufacturing a display device includes forming a light emitting element and a terminal on a substrate, forming a sealing film including a first inorganic insulating film and a second inorganic insulating film to cover the light emitting element and the terminal, forming a resist having a taper shape in which a thickness of an end portion on the sealing film becomes thinner as it goes to the terminal side by using a gray-tone mask, forming a taper shape in which thicknesses in end portions of the first inorganic insulating film and the second inorganic insulating film becomes thinner as it goes to the terminal side by etching, forming a touch electrode above the sealing film and forming wiring connected to the terminal via the end portions together with connecting to the touch electrode for detecting a touched position.

4 Claims, 17 Drawing Sheets

(51) Int. Cl.
*H01L 27/32* (2006.01)
*H01L 51/56* (2006.01)

(52) U.S. Cl.
CPC .... *H01L 51/56* (2013.01); *G06F 2203/04103* (2013.01); *H01L 27/3276* (2013.01)

(56) References Cited

U.S. PATENT DOCUMENTS

| | | | |
|---|---|---|---|
| 10,636,998 B2 * | 4/2020 | Shiobara | G03F 7/70008 |
| 10,795,472 B2 * | 10/2020 | Beak | G06F 3/047 |
| 2003/0096176 A1 | 5/2003 | Miyame et al. | |
| 2015/0042903 A1 | 2/2015 | Misaki | |
| 2017/0153747 A1 | 6/2017 | Yoon et al. | |
| 2018/0061899 A1 * | 3/2018 | Oh | H01L 51/5253 |
| 2019/0243506 A1 | 8/2019 | Yoon et al. | |
| 2020/0006702 A1 * | 1/2020 | Sonoda | G09F 9/30 |

FOREIGN PATENT DOCUMENTS

| | | |
|---|---|---|
| JP | 2009-128761 A | 6/2009 |
| JP | 2011-023558 A | 2/2011 |
| JP | 2012-068314 A | 4/2012 |
| JP | 2015-057678 A | 3/2015 |
| JP | 2017-102455 A | 6/2017 |
| WO | 2017/172375 A1 | 10/2017 |

\* cited by examiner

DISPLAY DEVICE AND METHOD OF MANUFACTURING DISPLAY DEVICE

CROSS-REFERENCE TO RELATED APPLICATION

The present application is Bypass Continuation of International Application No. PCT/JP2019/004440, filed on Feb. 7, 2019, which claims priority from Japanese Application No. JP2018-042980 filed on Mar. 9, 2018. The contents of these applications are hereby incorporated by reference into this application.

BACKGROUND OF THE INVENTION

1. Field of the Invention

The present invention relates to a display device and a method of manufacturing a display device.

2. Description of the Related Art

JP 2011-23558 A and JP 2015-57678 A disclose an organic EL display device with a touch panel and a liquid crystal display device with a touch panel. JP 2011-23558 A discloses that wiring of a touch panel crosses over end portions of a flattening film or an insulating film. JP 2015-57678 A discloses a technic causing an end portion of the flattening film to have a forward taper shape so that a conductive film is less likely to be interrupted as compared to a case where, when the conductive film is formed on the flattening film, the end portion of the flattening film has a vertical cross section or a reverse taper shape. The forward taper shape is formed by performing exposure using a halftone mask of which light transmittance changes stepwise.

SUMMARY OF THE INVENTION

Generally, by making a portion having different transmittances in a halftone mask, a stepwise taper shape can be formed in a cut portion such as an end portion of an insulating film. If portions having different transmittances are finely set, the stepwise portion can be theoretically caused to be gradual. However, in practice, the mask manufacturing process increases as the amount of making portions having different transmittances, and thus the cost can be increased.

In view of the above problems, an object of the present invention is, by reducing a taper angle of an end portion of the sealing film, for example, without increasing the cost, to more effectively prevent disconnection of wiring of a touch panel disposed above the corresponding sealing film.

According to another aspect of the present invention, there is provided a method of manufacturing a display device. The method for manufacturing a display device includes forming a light emitting element and a terminal on a substrate, forming a sealing film including a first inorganic insulating film and a second inorganic insulating film, forming a resist located on the sealing film and having a taper shape by using a gray-tone mask, forming taper shapes in an end portion of the first inorganic insulating film and an end portion of the second inorganic insulating film by etching, forming a touch electrode located on the sealing film and configured to detect a touched position, and forming a wiring connecting the touch electrode with the terminal and overlapping the end portion of the first inorganic insulating film and the end portion of the second inorganic insulating film. The sealing film covers the light emitting element and the terminal. A thickness of the taper shape becomes thinner as the taper shape goes to a side of the terminal. A thickness of each of the taper shapes becomes thinner as each of the taper shapes goes to the side of the terminal.

According to one aspect of the present invention, there is provided a display device. The display device includes a substrate, a light emitting element positioned on the substrate, a terminal positioned on the substrate, a sealing film including a first inorganic insulating film and a second inorganic insulating film, and covering the light emitting element and the terminal, a touch sensor including a touch electrode positioned on the sealing film, and a wiring connecting the touch electrode with the terminal. An end portion of the first inorganic insulating film and an end portion of the second inorganic insulating film have a first area and a second area. The first area has a first taper shape having a first taper angle. A thickness of the first taper shape decreases as the first taper shape goes to a side of the terminal. The second area has a second taper shape having a second taper angle. A thickness of the second taper shape decreases as the second taper shape goes to the side of the terminal. The second taper angle is larger than the first taper angle. The wiring overlaps the first area.

DETAILED DESCRIPTION OF THE INVENTION

Figure 1:
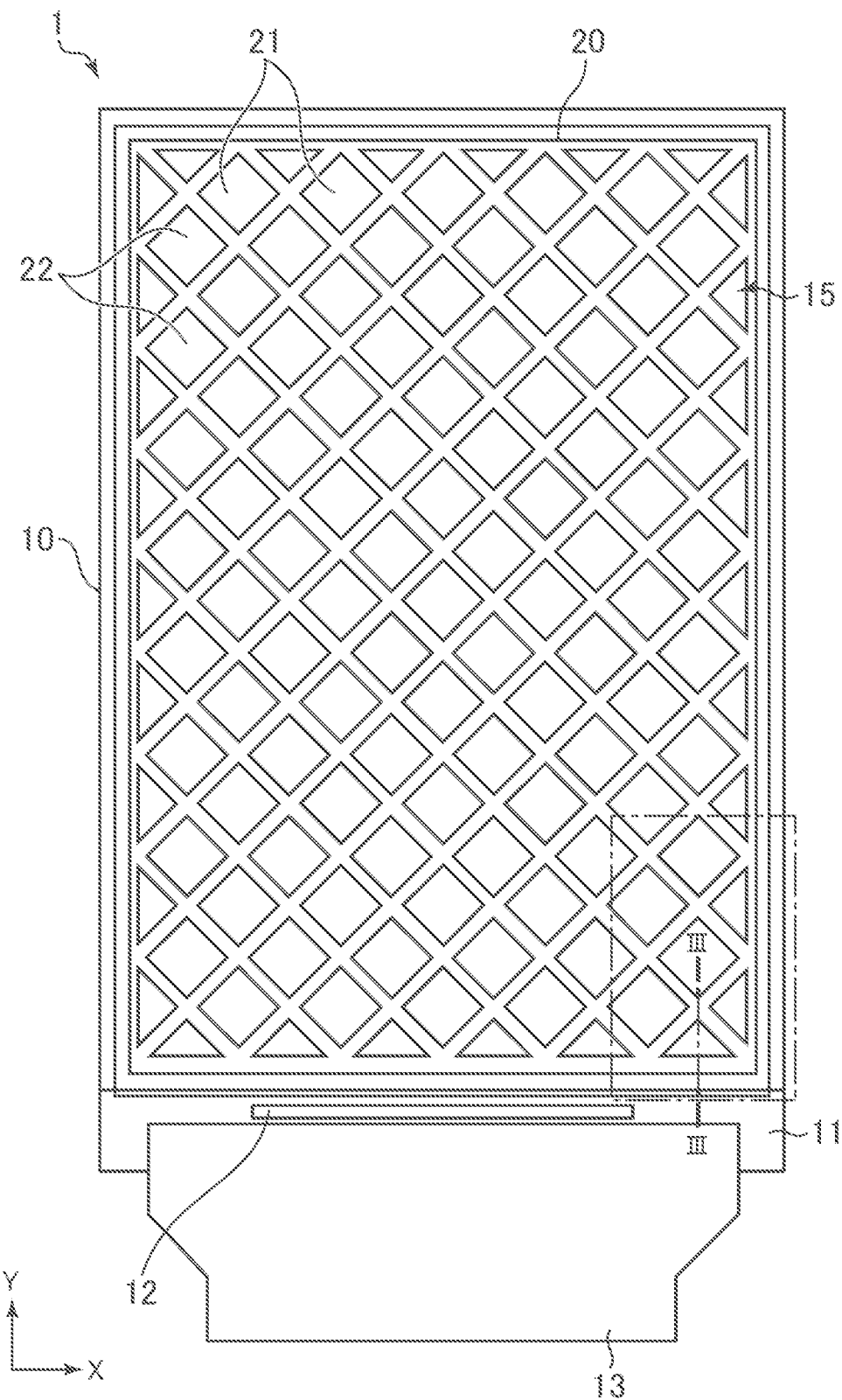
FIG. 1 is a schematic plan view of a touch sensor built-in display device according to the embodiment.

Hereinafter, embodiments of the present invention are described below with reference to the drawings. The disclosure is merely an example, and appropriate modifications without departing from the gist of the present invention which can be easily conceived by those skilled in the art are naturally included in the scope of the invention. In order to make the description clearer, the width, thickness, shape, and the like of each part as compared with the embodiment are schematically illustrated in the drawings, but the drawings are merely examples and are not interpreted to limit the present invention. In the present specification and each drawing, the same elements as those described above with reference to the already-existing drawings are denoted by the same reference numerals, and detailed description thereof may be appropriately omitted. In the detailed description of the present invention, when defining the positional relationship between a certain constituent and another constituent, the expressions "on" and "under" include not only a case of being positioned directly on or under but also a case of interposing another component therebetween, unless otherwise specified.

Figure 2:
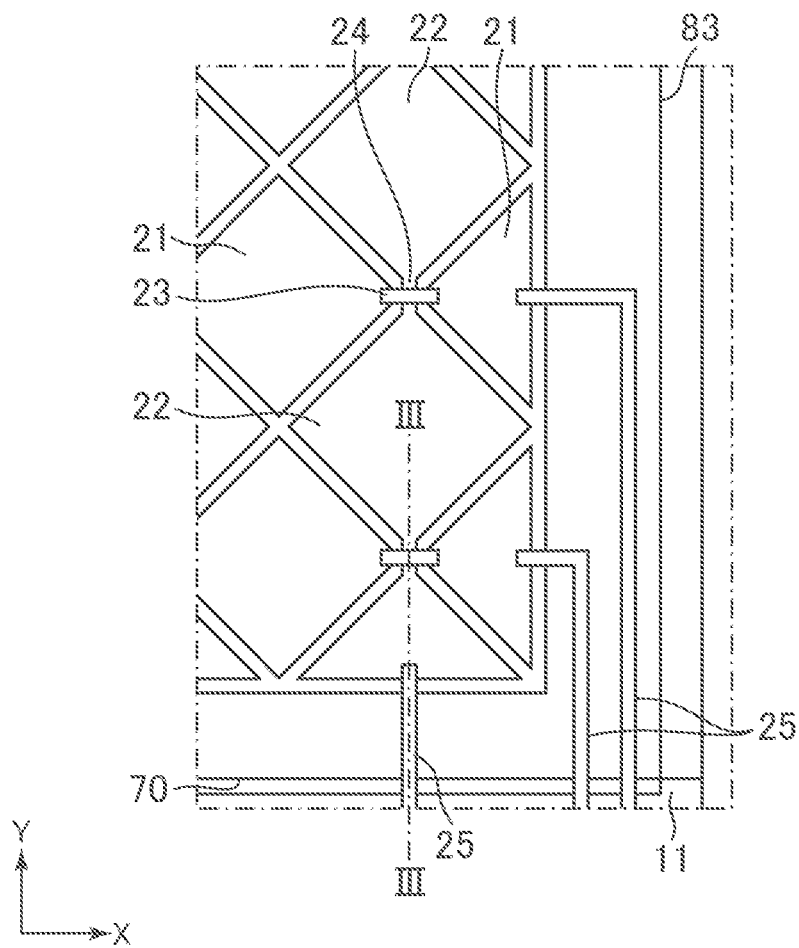
FIG. 2 is an enlarged plan view illustrating a frame with dashed lines illustrated in FIG. 1.

FIG. 1 is a plan view of a touch sensor built-in display device (hereinafter, also simply referred to as a display device) according to the embodiment. FIG. 2 is an enlarged view illustrating a frame with dashed lines illustrated in FIG. 1. Examples of the display device include an organic EL display device. A display device 1 includes a full-color pixel by combining unit pixels (sub-pixels) of a plurality of colors including, for example, red, green, and blue to display a full-color image.

The display device 1 includes a display panel 10 and a touch sensor 20 formed on a display area 15 of the display panel 10. A peripheral area (frame area) 11 is formed on the outside of the display area 15 of the display panel 10, an integrated circuit chip 12 for driving pixels is mounted on the peripheral area 11, and a flexible printed circuit board (FPC) 13 for electrical connection to the outside is connected. In the above description, a direction along a side to which the FPC 13 of the peripheral area 11 is connected is defined as an X direction, and a direction orthogonal thereto is a Y direction.

Figure 3:
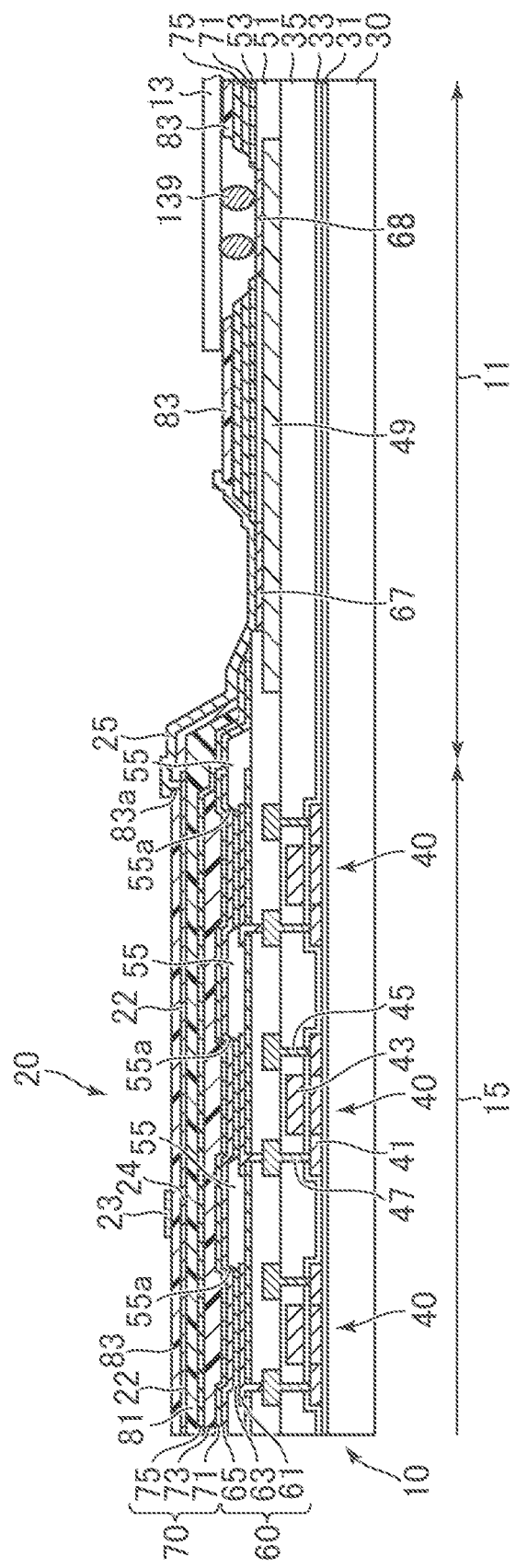
FIG. 3 is a schematic cross-sectional view illustrating a cross section along line III-III illustrated in FIG. 1.

FIG. 3 is a diagram illustrating an example of a cross section along line III-III illustrated in FIG. 1. For easier understanding of cross-sectional structure, in FIG. 3, hatching of some layers such as a substrate 30, a flattening film 51, and pixel isolation films 55 is omitted, and some layers are not illustrated. In the following description, the stacking direction is the upward direction.

For example, the substrate 30 is made of glass or a flexible resin such as polyimide. The substrate 30 is covered with an undercoat layer 31. A semiconductor layer 41 is formed on the undercoat layer 31, and the semiconductor layer 41 is covered with a gate insulating film 33. Gate electrodes 43 are formed on the gate insulating film 33, and the gate electrodes 43 are covered with a passivation film 35. Drain electrodes 45 and source electrodes 47 pass through the gate insulating film 33 and the passivation film 35 and are connected to the semiconductor layer 41. A thin film transistor 40 is configured with the semiconductor layer 41, the gate electrode 43, the drain electrode 45, and the source electrode 47. The thin film transistors 40 are provided to correspond to each of a plurality of unit pixels. The undercoat layer 31, the gate insulating film 33, and the passivation film 35 are formed, for example, from an inorganic insulating material such as $SiO_2$, SiN, or SiON.

In addition to the drain electrodes 45 and the source electrodes 47, wiring 49 is formed on the passivation film 35 in the peripheral area 11. The illustrated wiring 49 is wiring for electric connection with the touch sensor 20 and the FPC 13. The drain electrodes 45, the source electrodes 47, and the wiring 49 are covered with the flattening film 51, and the flattening film 51 is covered with an inorganic insulating film 53. The drain electrode 45, the source electrode 47, and the wiring 49 are formed from a conductive material including, for example, Al, Ag, Cu, Ni, Ti, and Mo. The flattening film 51 is formed from an organic insulating material such as an acrylic resin and has a flat upper surface. The inorganic insulating film 53 is formed, for example, from an inorganic insulating material such as $SiO_2$, SiN, or SiON.

A pixel electrode 61 (for example, an anode) is formed on the inorganic insulating film 53. The pixel electrode 61 passes through the flattening film 51 and the inorganic insulating film 53 and is connected to the source electrodes 47. The pixel electrode 61 is provided to correspond to each of the plurality of unit pixels. The pixel electrode 61 is formed as a reflective electrode. A first terminal 67 and a second terminal 68 exposing from the inorganic insulating film 53 or the like on the upper surface side of the substrate 30 are formed in the peripheral area 11, pass through the flattening film 51 and the inorganic insulating film 53 and are connected to each end portion of the wiring 49 on both sides. The second terminal 68 is disposed at a position farther from the display area 15 than the first terminal 67. That is, the second terminal 68 is disposed at a position farther from a light emitting element 60 described below than the first terminal 67. The first terminal 67 is, for example, a terminal dedicated to a touch panel formed with a touch sensor or the like described below, and a second terminal corresponds to, for example, a crimp terminal.

The pixel electrode 61, the first terminal 67, and the second terminal 68 are formed, for example, to include a conductive material including Al, Ag, Cu, Ni, Ti, Mo and the like. The first terminal 67 and the second terminal 68 are often exposed to the atmosphere during the process, and thus may include a material that hardly causes surface oxidation or the like, for example, indium-based oxide such as ITO or IZO. That is, a two-layer structure of a conductive material including Al, Ag, Cu, Ni, Ti, Mo, or the like and an indium-based oxide that hardly causes surface oxidation or the like may be used. When the display device 1 is a bottom emission type, the pixel electrode 61 needs to be formed as a transmissive electrode, and here, the above indium-based oxide can be used.

The pixel isolation films 55 are disposed around the pixel electrode 61. The pixel isolation film 55 is also referred to as a rib or a bank. Openings 55a that expose the pixel electrode 61 at the bottoms are formed on the pixel isolation films 55. Inner edge portions of the pixel isolation films 55 with the openings 55a are placed on peripheral edge portions of the pixel electrode 61 and have taper shapes that expand outward as it goes downward. The pixel isolation films 55 are formed in the display area 15 and near the boundary between the peripheral area 11 and the display area 15. The pixel isolation film 55 is formed from an organic insulating material such as an acrylic resin.

On the pixel electrode 61 that is exposed at the bottoms of the openings 55a of the pixel isolation films 55, light emitting layers 63 are formed separately from each other. The light emitting layers 63 correspond to the plurality of unit pixels and emit light. The light emitting layers 63 are individually formed by vapor deposition by using, for example, a mask. The light emitting layers 63 may be formed by vapor deposition as a uniform film that spreads over the entire display area 15. Here, the light emitting layers 63 emit light of a single color (for example, white), and for example, each component of a plurality of colors including red, green, and blue is extracted by color filters or color conversion layers. The light emitting layers 63 may be formed not only by vapor deposition but also by coating.

The light emitting layers 63 and the pixel isolation films 55 are covered with a counter electrode 65 (for example, a cathode). The counter electrode 65 is formed as a uniform film that spreads over the entire display area 15. The light emitting element 60 is configured with the light emitting layers 63, and the pixel electrode 61 and the counter electrode 65 with the light emitting layers 63 interposed therebetween. The light emitting layers 63 emit light by a current flowing between the pixel electrode 61 and the counter electrode 65. The counter electrode 65 is formed, for example, from a transparent conductive material such as ITO or a metal thin film such as MgAg. When the display device 1 is a top emission type, the counter electrode 65 is required to be formed as a transmissive electrode, and when the display device 1 is a metal thin film, it is required to reduce the film thickness to a degree in which light is transmitted.

The pixel isolation films 55 and the counter electrode 65 are sealed to be covered with a sealing film (passivation film) 70 and are shielded from moisture. The sealing film 70 has a stacked structure of three layers, for example, including a first inorganic insulating film 71, an organic insulating film 73, and a second inorganic insulating film 75 in this order from below. The first inorganic insulating film 71 and the second inorganic insulating film 75 are formed, for example, from an inorganic insulating material such as $SiO_2$, SiN, or SiON. The organic insulating film 73 is formed, for example, from an organic insulating material such as an acrylic resin, and flattens the upper surface of the sealing film 70.

The display device 1 includes the touch sensor 20 above the sealing film 70. Specifically, on the sealing film 70, a protective insulating film 81 is formed, and a plurality of first touch electrodes 21 and a plurality of second touch electrodes 22 two-dimensionally arranged on the protective insulating film 81 are formed. An interlayer insulating film 83 is formed on the first touch electrodes 21 and the second touch electrodes 22. The first touch electrodes 21 and the second touch electrodes 22 configure a drive electrode and a detection electrode of a capacitive touch sensor. The protective insulating film 81 and the interlayer insulating film 83 are formed from an organic insulating material such as an acrylic resin. The protective insulating film 81 may be omitted, and here, has a configuration in which the first touch electrodes 21 and the second touch electrodes 22 are formed above the sealing film 70.

As illustrated in FIGS. 1 and 2, the first touch electrodes 21 and the second touch electrodes 22 are formed, for example, to have a rectangular shape, so-called a rhomb shape (diamond shape) with the X direction (first direction) and the Y direction (second direction) intersecting (for example, orthogonal) thereto, as diagonal directions.

The first touch electrode 21 and the second touch electrode 22 each have a stacked structure including a first layer including a material such as Ag or MoW that makes ohmic contact with an indium-based material and a second layer provided on the first layer and including indium-based oxide such as ITO, IZO, and IGZO.

As illustrated in FIGS. 1 and 2, the plurality of first touch electrodes 21 are two-dimensionally arranged along the X direction and the Y direction, respectively. Among the first touch electrodes 21, the first touch electrodes 21 adjacent to each other in the X direction are connected via first connection lines 23, and the first touch electrodes 21 adjacent to each other in the Y direction are not connected. That is, the plurality of first touch electrodes 21 form a plurality of electrode rows extending in the X direction by connecting the first touch electrodes 21 adjacent to each other in the X direction via the first connection lines 23, and each electrode row is electrically separated from the electrode rows in the Y direction.

The plurality of second touch electrodes 22 are two-dimensionally arranged along the X direction and the Y direction. Among the second touch electrodes 22, the second touch electrodes 22 adjacent to each other in the Y direction are connected to each other via second connection lines 24 intersecting to the first connection lines 23 in a plan view, and the second touch electrodes 22 adjacent to each other in the X direction are not connected. That is, the plurality of second touch electrodes 22 form a plurality of electrode rows extending in the Y direction by connecting the second touch electrodes 22 adjacent to each other in the Y direction via the second connection lines 24, and each electrode row is electrically separated from the electrode rows in the X direction.

Each of the second touch electrodes 22 is disposed to be surrounded by the first touch electrodes 21 in a plan view. For example, each of the second touch electrodes 22 is disposed between the first touch electrodes 21 adjacent to each other in a direction (for example, in a direction of 45° or −45°) intersecting to both of the X and Y directions and is surrounded by four of the first touch electrodes 21. The first touch electrodes 21 and the second touch electrodes 22 are electrically separated from each other by spacing not to be in contact with each other.

According to the present embodiment, the plurality of first touch electrodes 21 and the plurality of second touch electrodes 22 are disposed on the same layer between the sealing film 70 and the interlayer insulating film 83, but the embodiment is not limited thereto, and the electrodes may be disposed on layers different from each other. That is, either of the first touch electrodes 21 and the second touch electrodes 22 may be disposed under the interlayer insulating film 83, and the others may be disposed on the interlayer insulating film 83. Both the first touch electrodes 21 and the second touch electrodes 22 may be disposed on the interlayer insulating film 83.

As illustrated in FIGS. 2 and 3, the first connection lines 23 and the second connection lines 24 are intersecting to each other in a plan view. The interlayer insulating film 83 is interposed between the first connection lines 23 and the second connection lines 24 intersecting to each other in a plan view, and both are electrically separated from each other.

According to the present embodiment, the first connection lines 23 are so-called bridge wiring disposed on the interlayer insulating film 83. The first connection lines 23 are connected to the first touch electrodes 21 via through holes formed in the interlayer insulating film 83. Meanwhile, the second connection lines 24 are formed to continue to the second touch electrodes 22 under the interlayer insulating film 83. The first connection lines 23 are formed, for example, from conductive materials including Al, Ag, Cu, Ni, Ti, Mo, and the like. The first connection lines 23 may have a three-layer structure of Ti, Al, and Ti, or may have a three-layer structure of Mo, Al, and Mo.

The present disclosure is not limited to the above configuration, but the second connection lines 24 may be disposed as bridge wiring on the interlayer insulating film 83, and the first connection lines 23 may be formed to continue to the first touch electrodes 21 under the interlayer insulating film 83. Intersection where the first connection lines 23 intersect to the second connection lines 24 as bridge wiring, and intersection where the second connection lines 24 intersect to the first connection lines 23 as bridge wiring may exist together.

As illustrated in FIGS. 2 and 3, the touch sensor 20 includes a plurality of lead wires 25 extracted from a peripheral edge portion of the display area 15 to the peripheral area 11. The lead wires 25 are formed, for example, simultaneously with the first connection lines 23 on the interlayer insulating film 83. For example, the lead wires 25 may have a three-layer structure of Ti, Al, and Ti or may have a three-layer structure of Mo, Al, and Mo. The lead wires 25 may be simply referred to as wiring.

Each of the lead wires 25 is connected to the first touch electrodes 21 or the second touch electrodes 22 via an opening 83a formed in the interlayer insulating film 83, and is formed to extend to the upper surface of the first terminal 67. The lead wires 25 are connected to the wiring 49 disposed on the lower side than the light emitting element 60 via the first terminal 67. Meanwhile, as illustrated in FIG. 3, the FPC 13 is connected to the second terminal 68 disposed on a side separated from the display area 15 via anisotropic conductive members 139.

Figure 4:
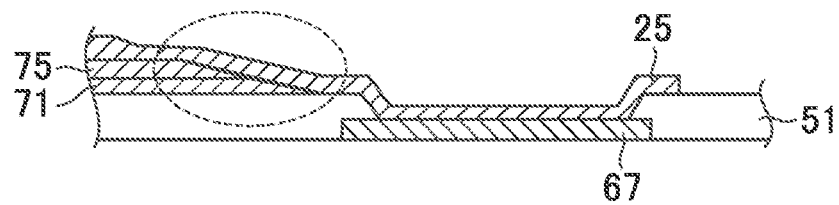
FIG. 4 is a diagram illustrating a form in which a peripheral area of an end portion of a first inorganic insulating film and an end portion of a second inorganic insulating film in a wiring area is enlarged.
Figure 5:
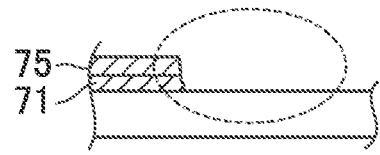
FIG. 5 is a diagram illustrating a form in which a peripheral area of the end portion of the first inorganic insulating film and the end portion of the second inorganic insulating film in a non-wiring area is enlarged.
Figure 6:
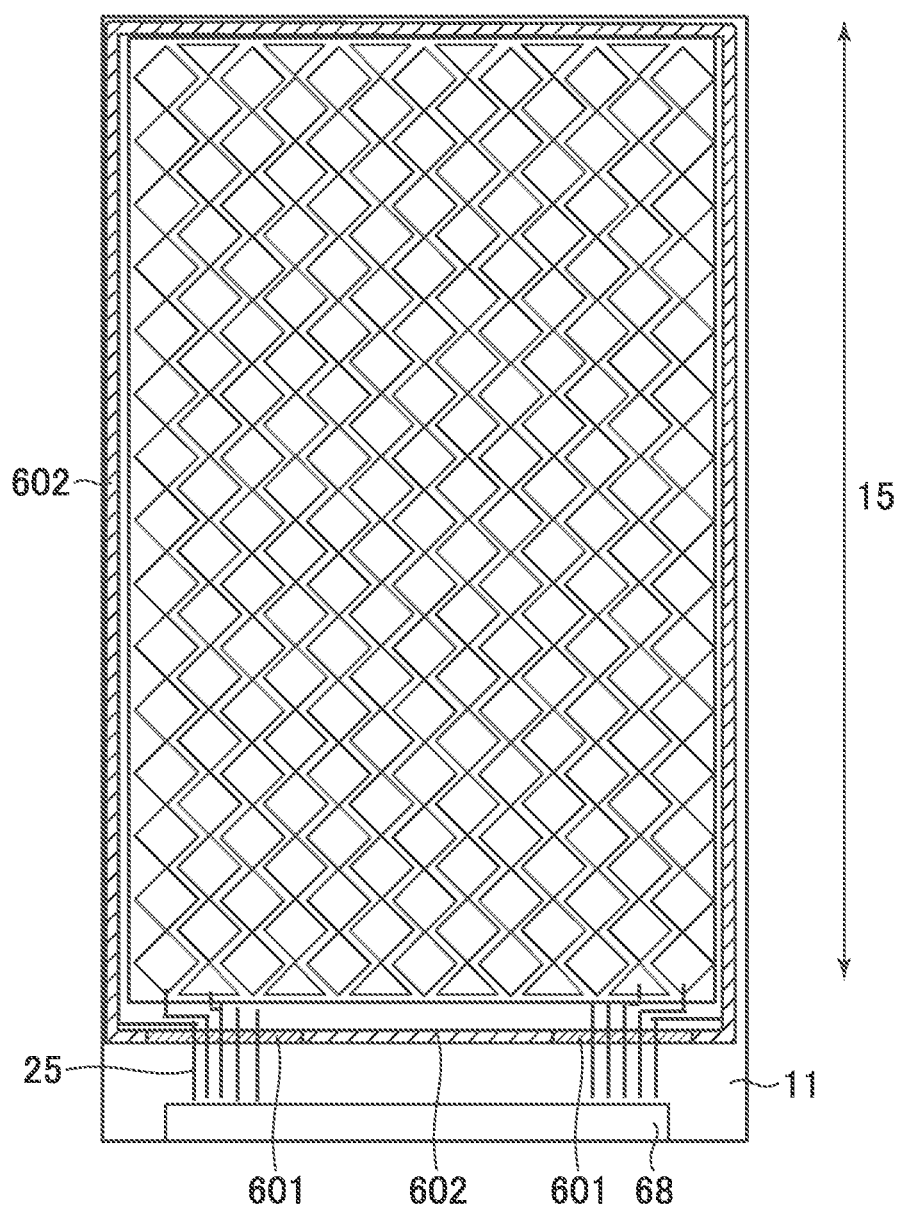
FIG. 6 is a diagram illustrating an example of dispositions of a wiring area and a non-wiring area in a plan view of the touch sensor built-in display device.

Subsequently, by using FIGS. 3 to 5, shapes of the end portion of the first inorganic insulating film 71 and the end portion of the second inorganic insulating film 75 are described. FIG. 4 is a diagram illustrating an example of an enlarged cross section of a peripheral area of the end portion of the first inorganic insulating film and the end portion of the second inorganic insulating film in an area (hereinafter, referred to as a "wiring area") in which the lead wires are provided. FIG. 5 is a diagram illustrating an example of an enlarged cross section of a peripheral area of the end portion of the first inorganic insulating film and the end portion of the second inorganic insulating film in an area (hereinafter, referred to as a "non-wiring area") in which lead wires are not provided. FIG. 6 is a diagram illustrating an example in which a wiring area and a non-wiring area are disposed in a plan view of the touch sensor built-in display device. For easier understanding, in FIGS. 4 and 5, elements other than the end portion of the first inorganic insulating film 71, the second inorganic insulating film 75, the first terminal 67, the flattening film 51, the lead wires 25, and the like are not illustrated.

As illustrated in FIGS. 3, 4, 6, and the like, in wiring areas 601 where the lead wires 25 are disposed (first area), a taper shape (first taper shape) in which the thickness of the end portion of the first inorganic insulating film 71 and the end portion of the second inorganic insulating film 75 becomes thinner as it goes toward the first terminal 67 is formed. A taper angle (first taper angle) of the taper shape is formed to be larger than 0° and equal to or smaller than 10°. Accordingly, the disconnection of the lead wires 25 in the end portion of the first inorganic insulating film 71 and the disconnection of the lead wires 25 in the end portion of the second inorganic insulating film 75 can be more effectively prevented in the area. The thickness of the lead wires 25 can be caused to be more constant, and the resistance value of the lead wires 25 can be made more stable, and the time constant and sensitivity of sensing by the touch sensor 20 can be made more stable. Since the end portion of the first inorganic insulating film 71 and the end portion of the second inorganic insulating film 75 can be controlled to about ±2 μm, the frame area can be narrowed.

Meanwhile, as illustrated in FIGS. 5 and 6, in a non-wiring area 602 (second area), the taper angle (second taper angle) of the taper shape (second taper shape) of the end portion of the first inorganic insulating film 71 and the end portion of the second inorganic insulating film 75 is formed to be larger than the first taper angle. Specifically, the second taper angle is formed, for example, to be 60° or larger. Accordingly, in the non-wiring area 602, the adjacent peripheral area 11 can be narrowed.

Figure 7A:
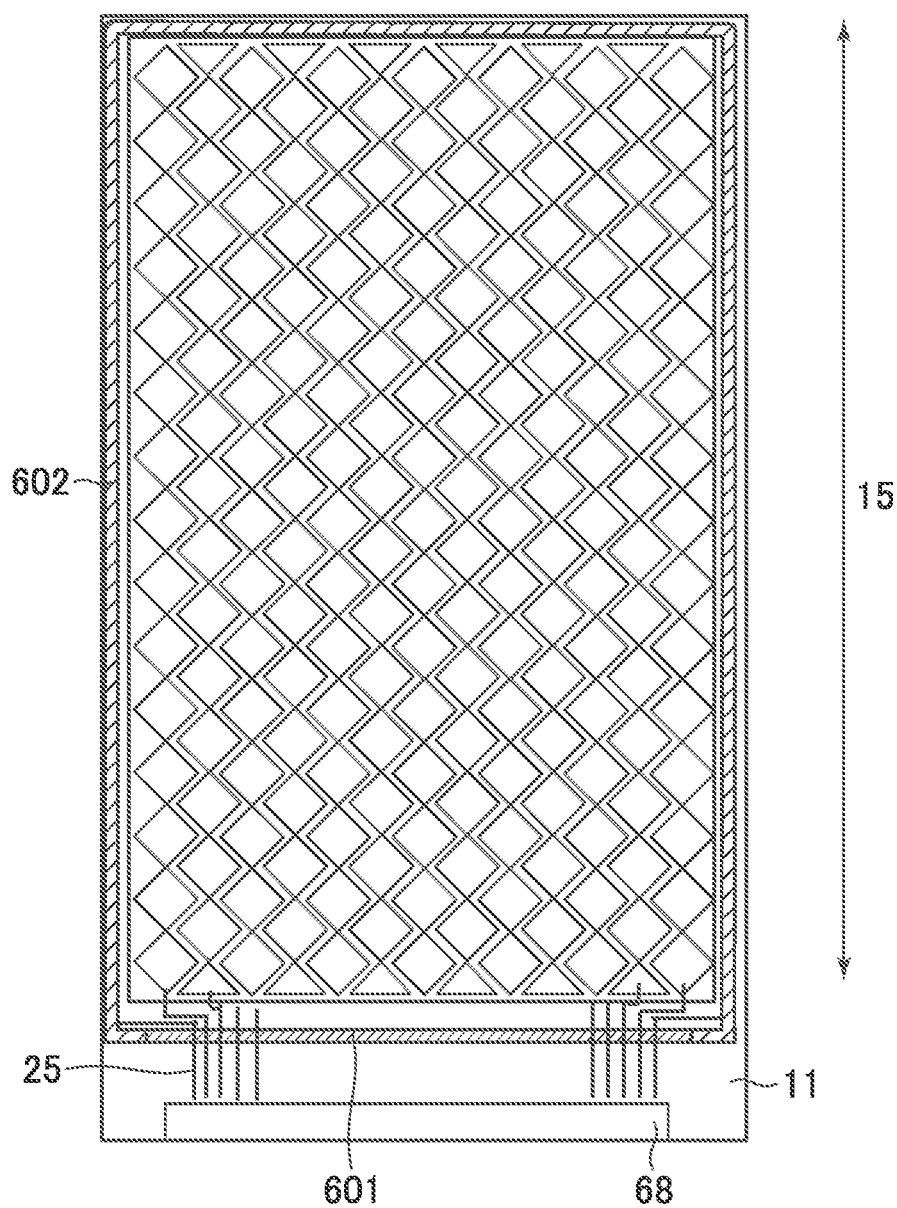
FIG. 7A is a diagram illustrating another example of dispositions of the wiring area and the non-wiring area illustrated in FIG. 6.

Subsequently, the dispositions of the wiring areas 601 and the non-wiring area 602 of the touch sensor built-in display device 1 in a plan view are described. As illustrated in FIG. 6, the wiring areas 601 are formed in an area where the lead wires 25 are provided on one side of one of the end portion of the first inorganic insulating film 71 and the end portion of the second inorganic insulating film 75 where the first terminal 67 is provided. Meanwhile, the non-wiring area 602 is formed in an area of the one side other than the area where the lead wires 25 are provided, and the other three sides. Here, the wiring areas 601 and the non-wiring area 602 may be formed so that the starting points where the taper shape starts by the end portion of the first inorganic insulating film 71 and the end portion of the second inorganic insulating film 75 are the same, the endpoints thereof are the same, or the starting points and the endpoints are different. In other words, for example, the wiring areas 601 may be formed to protrude in the direction facing the outside of the display device 1 with respect to the non-wiring area 602 (FIG. 7B), or in contrast, may be formed to protrude in the direction facing the inside of the display device 1 (FIG. 7C).

Figure 7B:
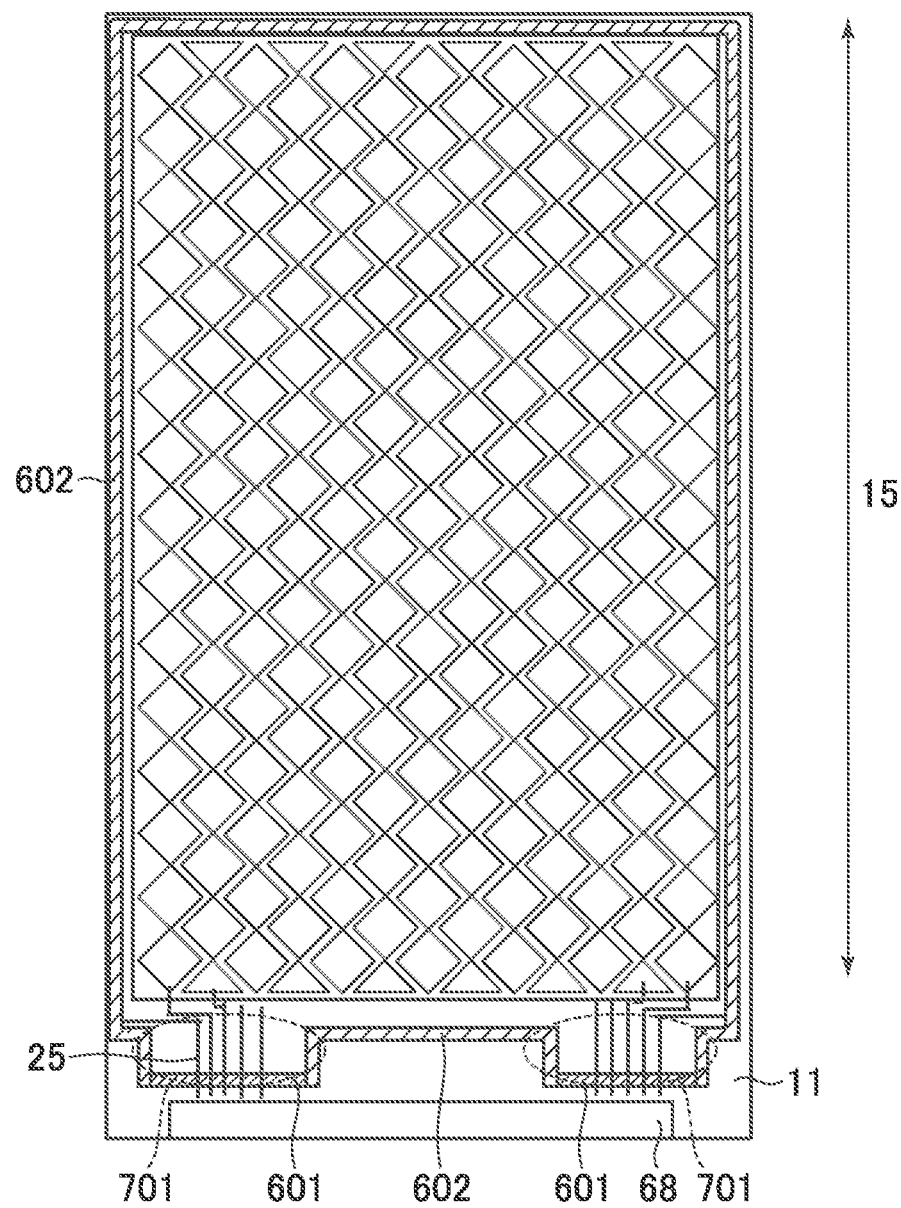
FIG. 7B is a diagram illustrating another example of dispositions of the wiring area and the non-wiring area in a plan view of the touch sensor built-in display device.
Figure 7C:
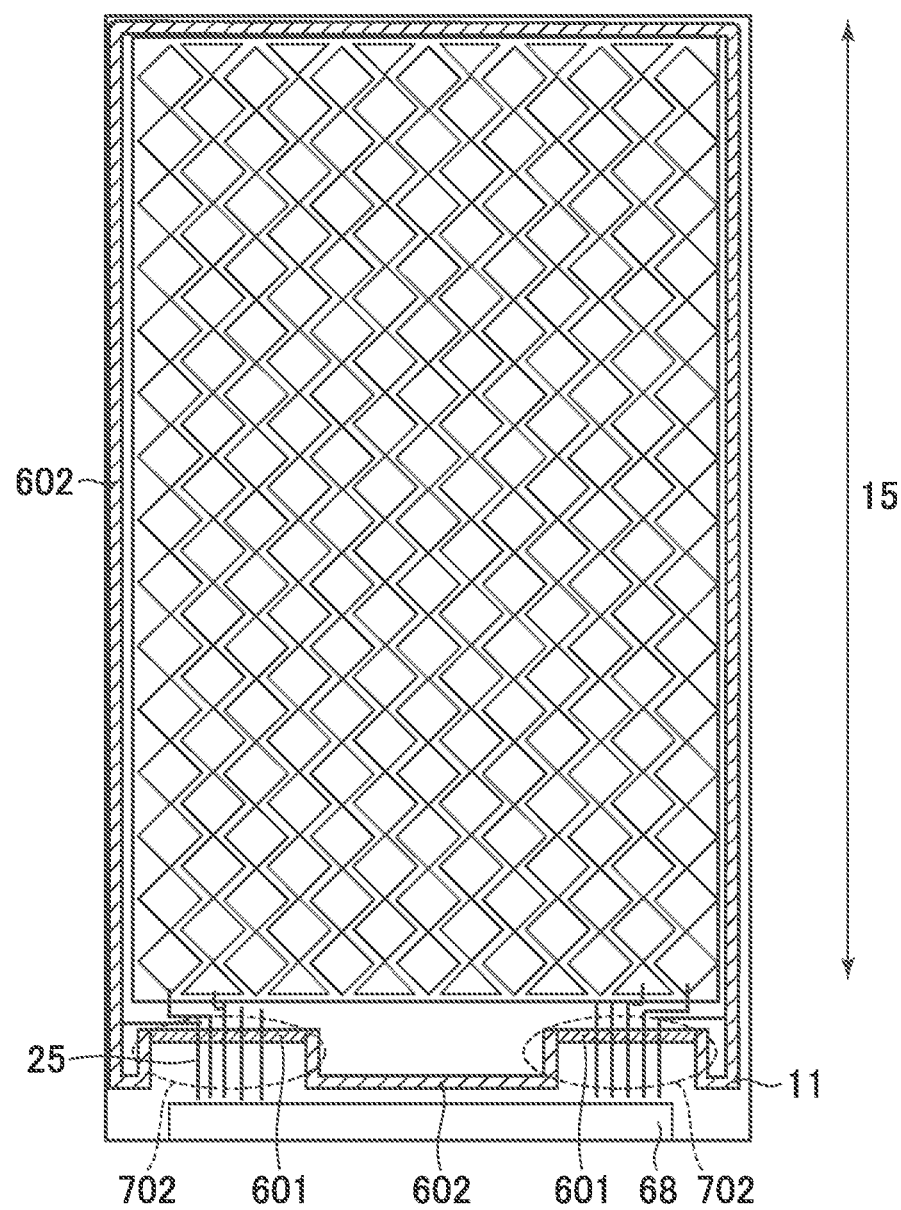
FIG. 7C is a diagram illustrating another example of dispositions of the wiring area and the non-wiring area in a plan view of the touch sensor built-in display device.

Specifically, as illustrated in FIG. 7B, the shapes of the end portion of the first inorganic insulating film 71 and the end portion of the second inorganic insulating film 75 may be a shape including two areas 701 that protrude in a direction facing the outside of the display device 1 in one side on the lower side of the rectangular shape illustrated in FIG. 6. Here, the wiring areas 601 are formed on a side on the outside of the display device 1 in the two areas 701 that protrude to the outside. Meanwhile, the non-wiring area 602 is formed in an area where the wiring areas 601 are not formed in the end portion of the first inorganic insulating film 71 and the end portion of the second inorganic insulating film 75. As illustrated in FIG. 7C, the shapes of the end portion of the first inorganic insulating film 71 and the end portion of the second inorganic insulating film 75 may be a shape of having two areas 702 that protrude in the direction facing the inside of the display device 1 on one side on the lower side of the rectangle shape illustrated in FIG. 6. Here, the wiring areas 601 are formed on a side on the inside of the display device 1 in the two areas 702 that protrude to the inside. Meanwhile, the non-wiring area 602 is formed in an area where the wiring areas 601 are not formed in the end portion of the first inorganic insulating film 71 and the end portion of the second inorganic insulating film 75.

The dispositions of the wiring areas 601 and the non-wiring area 602 illustrated in FIG. 6 are merely an example and may be other dispositions. For example, as illustrated in FIG. 7A, the wiring area 601 may be formed on the entire side of a side of the end portion of the first inorganic insulating film 71 and the end portion of the second inorganic insulating film 75, where the first terminal 67 is provided.

Figure 8:
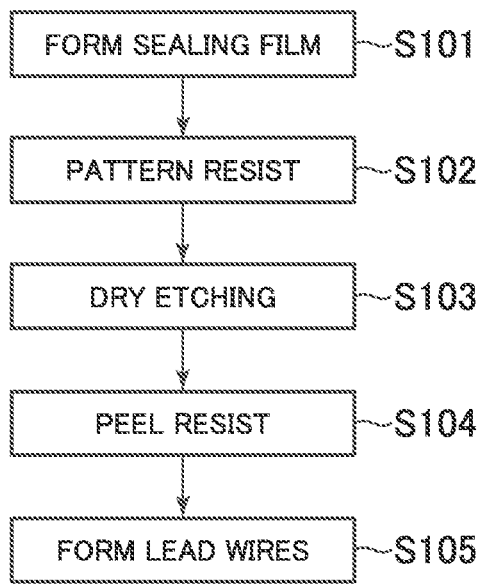
FIG. 8 is a diagram illustrating a flow of forming a taper shape of the end portion of the first inorganic insulating film and the end portion of the second inorganic insulating film.

Subsequently, a method of manufacturing the touch sensor built-in display device 1 according to the present embodiment is described. FIG. 8 is a diagram illustrating a flow of forming the taper shape of the end portion of the first inorganic insulating film 71 and the end portion of the second inorganic insulating film 75 in the method of manufacturing the touch sensor built-in display device according to the present embodiment. FIGS. 9 to 13 are diagrams illustrating each step of the method of manufacturing the touch sensor built-in display device. Specifically, FIGS. 9 to 13 are diagrams illustrating an example of an enlarged cross section of the peripheral area of the end portion of the first inorganic insulating film 71 of the end portion of the second inorganic insulating film 75 in the wiring areas 601 in each step. For easier understanding, in FIGS. 9 to 13, only relevant main components are illustrated, and for example, elements other than the end portion of the first inorganic insulating film 71, the second inorganic insulating film 75, the first terminal 67, the flattening film 51, and the like are not illustrated.

Figure 9:
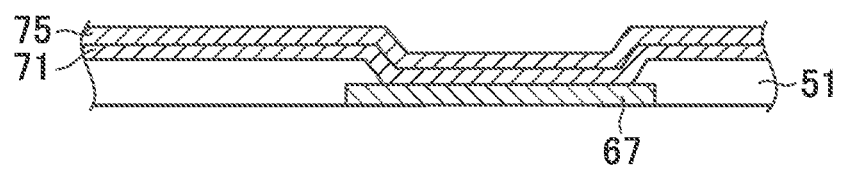
FIG. 9 is a diagram illustrating each step of a method of manufacturing the touch sensor built-in display device.

First, in the state where portions up to the light emitting element 60 are formed on the substrate 30, the sealing film 70 is formed to cover the light emitting element 60 (S101). Here, as illustrated in FIG. 9, in the peripheral area 11, on the upper portion of the flattening film 51, the first inorganic insulating film 71 and the second inorganic insulating film 75 are formed to cover the upper portion of the first terminal 67.

Figure 10:
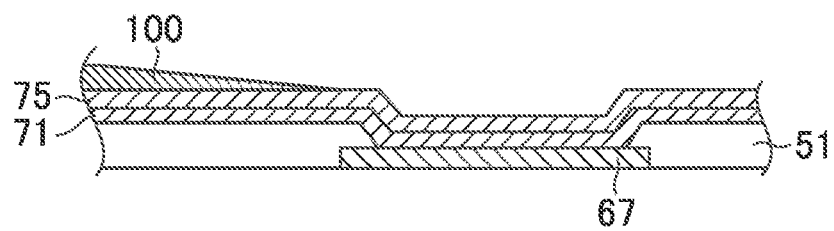
FIG. 10 is a diagram illustrating each step of the method of manufacturing the touch sensor built-in display device.

Subsequently, as illustrated in FIG. 10, a resist 100 is applied to the wiring area 601, and the applied resist 100 is patterned (S102). Specifically, by using a gray-tone mask described below, the resist 100 is formed so that the taper angle of the end portion thereof is larger than 0° and equal to or smaller than 5°.

Figure 14:
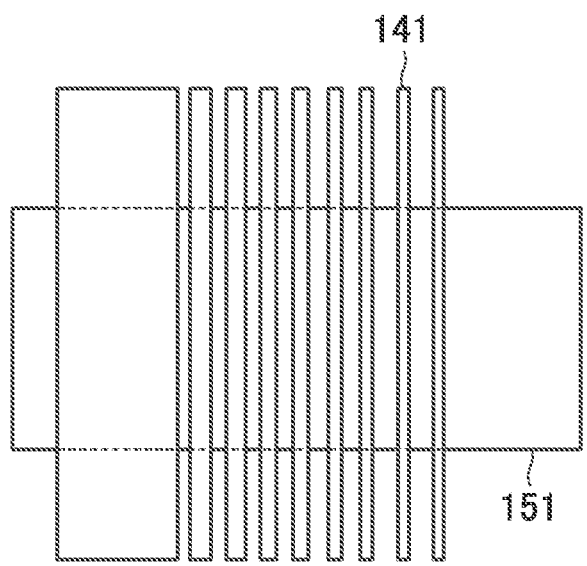
FIG. 14 is a diagram illustrating a gray-tone mask.
Figure 15:
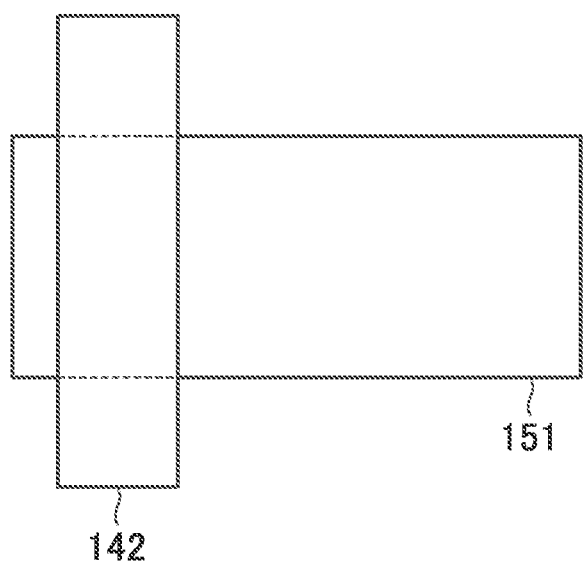
FIG. 15 is a diagram illustrating an exposure mask having a common pattern.

Here, as illustrated in FIG. 14, gray-tone masks 141 are configured to have a pattern in which the line width is in the resolution limit of an exposure machine or less and gradually decreases. The gray-tone masks 141 may be configured to have a pattern in which the pitch between the lines gradually increases. Specifically, for example, when the resolution limit of the exposure machine is 2 μm, the gray-tone masks 141 is configured so that the pattern and the space are changed between 1.0 to 2.0 μm, and the pattern becomes dense to coarse. Here, for example, the taper angle of the resist 100 when using an exposure mask 142 having a common pattern as illustrated in FIG. 15 is about 45° to 60°. In contrast, if the gray-tone masks 141 are used, the taper angle of the end portion of the resist 100 can be formed to be extremely small as described above. For easier understanding, in FIGS. 14 and 15, an exposure target 151 is illustrated as an exposure target, but the exposure targets in practice are, for example, the wiring areas 601 and the non-wiring area 602 as illustrated in FIGS. 6 and 7A to 7C.

In the non-wiring area 602, the resist 100 is patterned by using the exposure mask 142 of the common pattern. Accordingly, the taper angle of the end portion of the resist 100 is, for example, about 45° to 60°. The gray-tone masks 141 and the exposure mask 142 may be integrally formed or may be independently formed.

Figure 11:
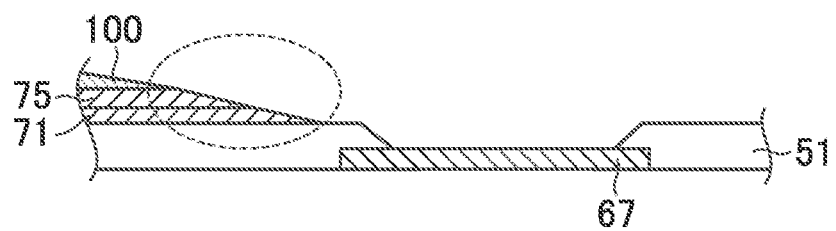
FIG. 11 is a diagram illustrating each step of the method of manufacturing the touch sensor built-in display device.

Subsequently, as illustrated in FIG. 11, in a state where the resist 100 patterned as described above is formed, dry etching is performed (S103). Here, the gas ratio of 02 in etching gas is preferably higher than the gas ratio of 02 in common etching using the exposure mask 142 of a common pattern where the gray-tone masks 141 are not used. In the wiring area 601, as described above, the end portion of the resist 100 has a taper angle of larger than 0° and equal to or smaller than 5°. Accordingly, in the course of dry etching, as the resist 100 recedes to the display area 15 side, that is, the end portion of the resist 100 moves to face the display area 15 side, the first inorganic insulating film 71 and the second inorganic insulating film 75 are etched. Accordingly, as illustrated in a portion surrounded by a broken line of FIG. 11, in the wiring area 601, the taper angle of the end portions of the first inorganic insulating film 71 and the second inorganic insulating film 75 can be formed to be larger than 0° and equal to or smaller than 10°.

In the non-wiring area 602, the taper angle of the end portion of the resist 100 is about 45° to 60° as usual as described above, and thus the taper angles of the end portions of the first inorganic insulating film 71 and the second inorganic insulating film 75 are 60° or larger.

Figure 12:
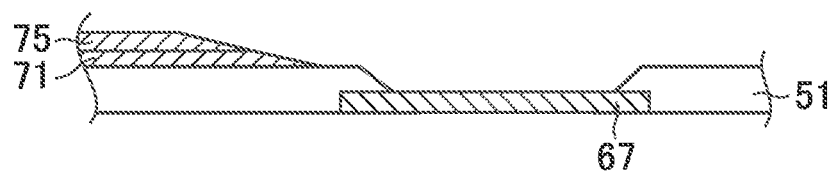
FIG. 12 is a diagram illustrating each step of the method of manufacturing the touch sensor built-in display device.
Figure 13:
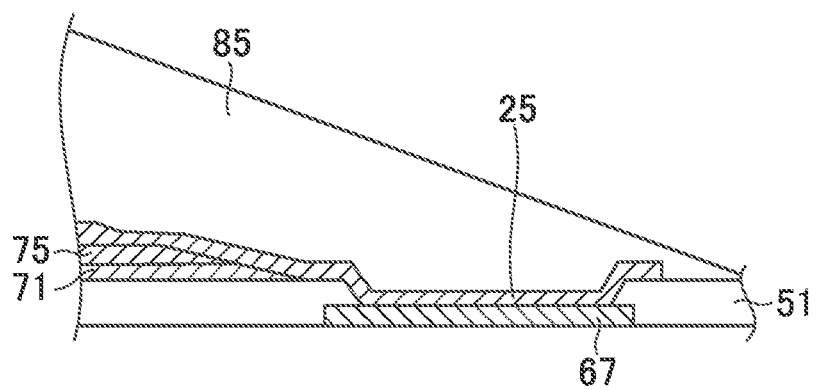
FIG. 13 is a diagram illustrating each step of the method of manufacturing the touch sensor built-in display device.

Subsequently, as illustrated in FIG. 12, the resist 100 is peeled off (S104). Then, the lead wires 25 are formed (S105). The lead wires 25 may be configured to be formed together with the first connection lines 23. Thereafter, a protective film 85 and the like that cover the touch sensor 20 are formed, and the touch sensor built-in display device 1 is completed, but a method thereof is well-known and thus is not described.

The present invention is not limited to the above embodiment, and various modifications can be made. For example, the configuration described in the above embodiment can be replaced with a substantially the same configuration, a configuration that achieves the same operation effect, or a configuration that can achieve the same object.

Specifically, for example, as illustrated in S101 to S105, as long as the taper angle of the end portions of the first inorganic insulating film 71 and the second inorganic insulating film 75 are formed to be larger than 0° and equal to or smaller than 10°, and then the lead wires 25 are formed on the first inorganic insulating film 71 and the second inorganic insulating film 75 having the corresponding taper angle, an order of forming other layers for forming the first touch electrodes 21, the second touch electrodes 22, or the like is not limited to the order described above. Further, in the area where the lead wires 25 are formed, with respect to the end portions of the protective insulating film 81 and the interlayer insulating film 83, together with making the corresponding end portions to have taper shape by performing dry etching or the like after patterning a resist by using gray-tone masks as described in S102 to S104, the taper angle of the corresponding taper shape may be configured to be larger than 0° and equal to or smaller than 10°. Accordingly, in the same manner, also by the corresponding portions, the disconnection of the corresponding lead wires 25 can be effectively prevented or the like.

The terminal in the claims corresponds to the first terminal 67 in the above embodiment, and the touch electrode corresponds to the second touch electrode 22.

While there have been described what are at present considered to be certain embodiments of the invention, it will be understood that various modifications may be made thereto, and it is intended that the appended claims coverall such modifications as fall within the true spirit and scope of the invention.

What is claimed is:
1. A display device comprising:
a substrate;
a light emitting element positioned on the substrate;
a terminal positioned on the substrate;

a sealing film including a first inorganic insulating film and a second inorganic insulating film, and covering the light emitting element and the terminal;

a touch sensor including a touch electrode positioned on the sealing film; and a wiring connecting the touch electrode with the terminal, wherein an end portion of the first inorganic insulating film and an end portion of the second inorganic insulating film have a first area and a second area, the first area and the second area continuously form an outermost border of the sealing film, the first area has a first taper shape having a first taper angle, a thickness of the first taper shape decreasing as the first taper shape goes to a side of the terminal, the second area has a second taper shape having a second taper angle, a thickness of the second taper shape decreasing as the second taper shape goes to the side of the terminal, the second taper angle is larger than the first taper angle, and the wiring overlaps the first area.

2. The display device according to claim 1, wherein the end portions have a side overlapping the wiring, and the first area includes an entirety of the side.

3. The display device according to claim 1, wherein the first area protrudes from a side of the second area toward a side of the light emitting element.

4. The display device according to claim 1, wherein the first area protrudes from a side of the light emitting element toward a side of the second area.

* * * * *